United States Patent [19]

Merrick

[11] Patent Number: 4,602,322
[45] Date of Patent: Jul. 22, 1986

[54] TRANSISTOR RECTIFIER

[75] Inventor: Edwin B. Merrick, Stow, Mass.

[73] Assignee: Hewlett-Packard Company, Palo Alto, Calif.

[21] Appl. No.: 621,401

[22] Filed: Jun. 18, 1984

Related U.S. Application Data

[62] Division of Ser. No. 595,756, Apr. 2, 1984.

[51] Int. Cl.[4] .................................................. H02M 7/217
[52] U.S. Cl. ..................................... 363/127; 323/311
[58] Field of Search ................. 363/45, 123, 125, 127; 323/311

[56] References Cited

U.S. PATENT DOCUMENTS

| 2,928,036 | 3/1960 | Walker ................................ 363/127 |
| 3,667,028 | 5/1972 | Leufgen ............................... 363/127 |

FOREIGN PATENT DOCUMENTS

| 747784 | 4/1956 | United Kingdom ................ 307/296 |
| 819909 | 4/1981 | U.S.S.R. ................................. 363/127 |

OTHER PUBLICATIONS

RCA Technical Note No. 627: "High Efficiency Low Voltage Rectifier", Aug. 1965.

Primary Examiner—William H. Beha, Jr.
Attorney, Agent, or Firm—Donald N. Timbie

[57] ABSTRACT

A power supply for producing DC voltage with a minimum voltage drop from a source voltage that is either AC or DC in which the emitter-base junction of a transistor is coupled to the source so as to provide base current required to turn the transistor on, an output capacitor is connected in series with the emitter-collector path, and a capacitor and resistor are connected in parallel in the base circuit of the transistor.

1 Claim, 2 Drawing Figures

TRANSISTOR RECTIFIER

BACKGROUND OF THE INVENTION

This application is a division of U.S. patent application Ser. No. 06/595,756, filed April 2, 1984, in the name of Edwin B. Merrick, entitled "Transducer Coupling".

In the aforesaid patent application, DC operating potentials are derived from either AC or DC voltages provided by a power source by a power supply employing rectifying means. If the source voltage is DC, it passes through the rectifier; and if it is AC, it is rectified. If a diode is used as a rectifying means, the voltage drop of about one-half of a volt across it can make a significant reduction in the operating potential derived.

BRIEF SUMMARY OF THE INVENTION

The power supply of this invention is the same as that shown in the aforesaid patent application in which the emitter-collector path of a transistor is used as the rectifying means. The emitter-collector path is connected in series with a capacitor across which the desired DC operating potential is to appear, and the base-emitter path of the transistor is connected in shunt with the power source so that current will flow in said latter path and therefore in the emitter-collector path. Thus, the voltage drop introduced by the rectifying means is the very small drop between the emitter and collector of the transistor.

DETAILED DESCRIPTION OF THE INVENTION

Figure 1:
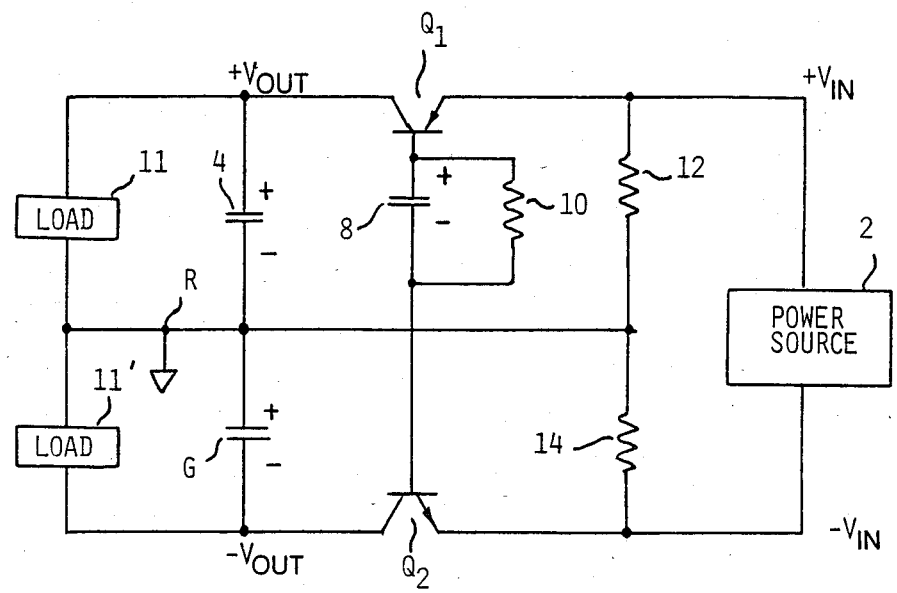
FIG. 1 is a schematic representation of an embodiment of this invention that provides positive and negative DC operating potential.

Reference is now made to FIG. 1 in which a power supply is shown that may derive from a power source 2 DC operating potentials $+V$ and $-V$ with respect to a reference potential R, such as ground. The emitter of a PNP transistor $Q_1$ is connected to one side of the power source 2, and the collector of $Q_1$ is connected via an output capacitor 4 to a point of the reference potential R. The emitter of an NPN transistor $Q_2$ is connected to the other side of the power source 2, and its collector is connected via a capacitor 6 to the point of reference potential R. A parallel combination of a capacitor 8 and a resistor 10 is connected between the bases of $Q_1$ and $Q_2$. An output voltage $+V$ is produced across the capacitor 4; and an output voltage $-V$ is produced across the capacitor 6. A load 11 is connected in shunt with the capacitor 4, and a load 11' is connected in shunt with the capacitor 6. In order to assure that these voltages will have equal values, equal resistors 12 and 14 may be respectively connected between the emitters of $Q_1$ and $Q_2$ and the point of reference potential R.

The operation of the power supply is as follows. In AC operation when the emitter of $Q_1$ goes positive, the emitter-base junction of $Q_1$ and the emitter-base junction of $Q_2$ conduct so as to charge the capacitor 8 in the polarity indicated. Both $Q_1$ and $Q_2$ therefore have equal base currents flowing in a direction such as to turn them on and charge the capacitors 4 and 6 in the polarities shown. In the subsequent oppositely-poled half-cycle of the voltage from the source 2, $Q_1$ and $Q_2$ do not conduct and the resistor 10 partially discharges the capacitor 8 to permit the flow of base currents at the next positive voltage crest. With the circuit values indicated below, $Q_1$ and $Q_2$ are able to charge the capacitors 4 to 6 to within 100 mv of the peaks of the AC voltage provided by the power source 2 while supplying a 1 milliampere load current. This is important because it enables more DC operating potential to be supplied. Use of silicon diodes in place of the transistors $Q_1$ and $Q_2$ would cause a difference of about 0.6 volt between the peak of the AC voltage from the power source 2 and $+V$ and $-V$.

When the power source 2 provides a DC voltage of an appropriate polarity, $Q_1$ and $Q_2$ conduct continuously because current for the bases continuously flows through the resistor 10. The value of $+V$ and $-V$ respectively produced across the capacitors 4 and 6 is 50 mv less than half the DC voltage.

TABLE

| | |
|---|---|
| $Q_1$ — PNP | $C8 = 1.0$ uf |
| $Q_2$ — NPN | $R10 = 250K$ |
| $C_4 = 22$ uf | $R12 = 700$ |
| $C_6 = 22$ uf | $R14 = 700$ |

Figure 2:
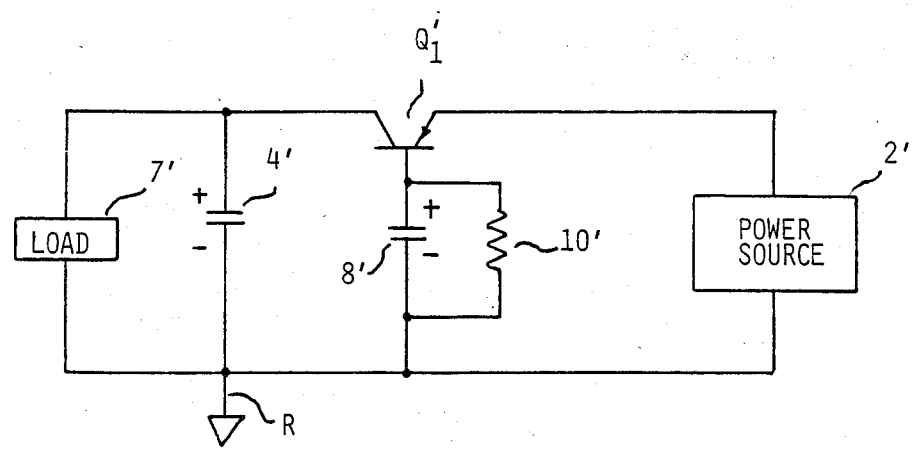
FIG. 2 is a schematic representation of an embodiment of this invention that provides a single DC operating potential.

FIG. 2 is a schematic illustration of a power supply embodying the invention that provides one DC operating potential. Components corresponding in function to components of FIG. 1 are identified by the same symbol primed. Again, if the power source 2' is AC, current will flow in the base of $Q_1'$ during positive half-cycles so as to charge the capacitor 8' in the polarity shown and turn on $Q_1'$, thereby charging the capacitor 4' in the polarity indicated. During the following negative half-cycle, the capacitor 8' is partially discharged through the resistor 10' so that when the next positive crest occurs, base current can flow and turn on $Q_1'$ as is required to charge the capacitor 4'. If an output voltage having a negative polarity is desired, a PNP transistor is used in place of $Q_1'$. In the event that the power source 2 is DC, it must be polarized so that base current flows continuously through the resistor 10' if $Q_1'$ is to conduct and charge the capacitor 4'.

If it is considered that a phantom reference potential exists at the center of the capacitor 8 and at the center of the resistor 10 of FIG. 1, it is seen that the circuit of FIG. 2 is one-half of the circuit of FIG. 1.

What is claimed is:

1. A power supply, comprising
  a pair of input terminals between which an AC or DC power source may be connected,
  a PNP transistor having electrodes respectively performing as an emitter, a collector and a base, said electrode performing as an emitter being connected to one of said input terminals,
  a first output capacitor connected between said collector and a point of reference potential,
  an NPN transistor having electrodes respectively performing as an emitter, a collector and a base, said latter electrode performing as an emitter being connected to the other of said input terminals,
  a second output capacitor connected between said collector of said NPN transistor and the point of reference potential, and
  a resistor and a capacitor connected in parallel between the base of said PNP transistor and the base of said NPN transistor.

* * * * *